(12) United States Patent
DePaula et al.

(10) Patent No.: US 8,561,910 B2
(45) Date of Patent: Oct. 22, 2013

(54) MEMORY PROGRAMMING METHODS AND MEMORY PROGRAMMING DEVICES

(75) Inventors: Andrew DePaula, Spokane, WA (US); Larry Aamodt, College Place, WA (US); Ronald Vyhmeister, Yucaipa, CA (US)

(73) Assignee: intelliPaper, LLC, Spokane, WA (US)

( * ) Notice: Subject to any disclaimer, the term of this patent is extended or adjusted under 35 U.S.C. 154(b) by 4 days.

(21) Appl. No.: 13/080,830

(22) Filed: Apr. 6, 2011

(65) Prior Publication Data

US 2012/0075941 A1 Mar. 29, 2012

Related U.S. Application Data

(63) Continuation-in-part of application No. 12/604,300, filed on Oct. 22, 2009, now Pat. No. 8,047,443.

(60) Provisional application No. 61/321,801, filed on Apr. 7, 2010.

(51) Int. Cl.
*G06K 19/06* (2006.01)

(52) U.S. Cl.
USPC .......................................... 235/492; 235/435

(58) Field of Classification Search
USPC ................................................. 235/435, 492
See application file for complete search history.

(56) References Cited

U.S. PATENT DOCUMENTS

| | | |
|---|---|---|
| D267,009 S | 11/1982 | Doi |
| 4,780,603 A | 10/1988 | Hamada |
| 4,849,617 A | 7/1989 | Ueda |
| 4,850,105 A | 7/1989 | Nakajima et al. |
| 5,004,899 A | 4/1991 | Ueda |
| D320,225 S | 9/1991 | Ido et al. |
| 5,710,421 A | 1/1998 | Kokubu |
| 5,818,030 A | 10/1998 | Reyes |

(Continued)

FOREIGN PATENT DOCUMENTS

| | | |
|---|---|---|
| DE | 19601358 | 7/1996 |
| EP | 1798732 A1 | 6/2007 |

(Continued)

OTHER PUBLICATIONS

Sony Press Release; "Toppan and Sony Successfully Develop 25GB Paper Disc"; Apr. 15, 2004; www.sony.net/SonyInfo/News/Press_Archive/2004/04-15E/; 2pp.

(Continued)

*Primary Examiner* — Kristy A Haupt
(74) *Attorney, Agent, or Firm* — Wells St. John P.S.

(57) ABSTRACT

Memory programming devices include a print head that moves across a substrate to deposit memory material on the substrate to form an array of memory cells and programming circuitry coupled to the print head so that the programming circuitry moves across the substrate along with the print head and that, for individual memory cells of the array, is positioned proximate the individual memory cell and writes data to the individual memory cell. Memory programming methods include depositing memory material above a first portion of an electrically conductive bitline printed on a substrate to form a memory cell and using programming circuitry positioned proximate the memory cell, storing data in the memory cell by altering a characteristic of the memory cell, the characteristic remaining altered after the programming circuitry is moved away from the memory cell.

17 Claims, 2 Drawing Sheets

(56) References Cited

U.S. PATENT DOCUMENTS

| | | |
|---|---|---|
| 5,888,624 A | 3/1999 | Haghiri et al. |
| 6,097,605 A | 8/2000 | Klatt et al. |
| 6,109,939 A | 8/2000 | Kondo et al. |
| 6,333,854 B1 | 12/2001 | Sasaoka et al. |
| D452,865 S | 1/2002 | Wallace et al. |
| 6,341,728 B1 | 1/2002 | Kondo et al. |
| D458,935 S | 6/2002 | Hiroki |
| 6,480,390 B2 | 11/2002 | Matsumiya et al. |
| 6,531,775 B1 | 3/2003 | Kobayashi et al. |
| 6,547,151 B1 | 4/2003 | Baldi |
| 6,567,273 B1 | 5/2003 | Liu et al. |
| 6,580,615 B1 | 6/2003 | Nakanishi et al. |
| 6,665,201 B1 | 12/2003 | Spencer et al. |
| D487,458 S | 3/2004 | Gentil et al. |
| 6,699,053 B2 | 3/2004 | Kuroda |
| 6,700,788 B2 | 3/2004 | Matsushita et al. |
| 6,735,656 B2 | 5/2004 | Hanke et al. |
| D490,814 S | 6/2004 | Kim |
| 6,744,634 B2 | 6/2004 | Yen |
| 6,773,280 B2 | 8/2004 | Sasaki et al. |
| 6,783,060 B2 | 8/2004 | Marappan |
| 6,808,424 B2 | 10/2004 | Kaneshiro et al. |
| 6,824,066 B2 | 11/2004 | Weyant |
| 6,858,925 B2 | 2/2005 | Wada et al. |
| 6,865,086 B2 | 3/2005 | Gochnour et al. |
| 6,900,988 B2 | 5/2005 | Yen |
| 6,908,038 B1 | 6/2005 | Le |
| 6,970,359 B2 | 11/2005 | Gochnour et al. |
| 6,994,263 B2 | 2/2006 | Ueda et al. |
| 7,004,794 B2 | 2/2006 | Wang et al. |
| D518,483 S | 4/2006 | Yu et al. |
| 7,025,623 B2 | 4/2006 | Katsumata et al. |
| 7,040,919 B2 | 5/2006 | Yao |
| 7,083,107 B2 | 8/2006 | Sakamoto et al. |
| 7,102,891 B1 | 9/2006 | Miks et al. |
| 7,104,809 B1 | 9/2006 | Huang |
| D532,788 S | 11/2006 | Cuellar et al. |
| D542,797 S | 5/2007 | Cuellar et al. |
| 7,218,528 B2 | 5/2007 | Chen |
| D545,311 S | 6/2007 | Wai |
| 7,233,499 B2 | 6/2007 | Yu et al. |
| 7,269,004 B1 | 9/2007 | Ni et al. |
| D553,130 S | 10/2007 | Fiorentino |
| 7,334,725 B2 | 2/2008 | Dan |
| 7,340,540 B2 | 3/2008 | Miller et al. |
| 7,344,072 B2 | 3/2008 | Gonzalez et al. |
| D565,572 S | 4/2008 | Yang |
| 7,355,860 B2 | 4/2008 | Miller et al. |
| 7,357,655 B1 | 4/2008 | Van der Steen |
| 7,364,090 B2 | 4/2008 | Cuellar et al. |
| 7,377,448 B2 | 5/2008 | Dan et al. |
| 7,392,358 B2 | 6/2008 | Chen et al. |
| 7,434,739 B2 | 10/2008 | Matsuura et al. |
| D591,753 S | 5/2009 | Nakano et al. |
| 7,537,169 B2 | 5/2009 | Gonzalez et al. |
| D612,385 S | 3/2010 | Aoki |
| 7,721,956 B2 | 5/2010 | Williams et al. |
| 2002/0036236 A1 | 3/2002 | Kondo et al. |
| 2002/0074415 A1 | 6/2002 | Kondo et al. |
| 2002/0084332 A1 | 7/2002 | Kondo et al. |
| 2002/0116668 A1 | 8/2002 | Chhor et al. |
| 2003/0081388 A1 | 5/2003 | Yang |
| 2003/0109179 A1 | 6/2003 | Kaneshiro et al. |
| 2004/0070952 A1 | 4/2004 | Higuchi et al. |
| 2004/0087213 A1 | 5/2004 | Kao |
| 2004/0089717 A1 | 5/2004 | Harari et al. |
| 2004/0089724 A1 | 5/2004 | Lasch et al. |
| 2004/0188531 A1 | 9/2004 | Gengel et al. |
| 2005/0077164 A1 | 4/2005 | Dhers |
| 2006/0098485 A1 | 5/2006 | Leenders et al. |
| 2006/0118639 A1 | 6/2006 | Kean et al. |
| 2006/0154525 A1 | 7/2006 | Bychov et al. |
| 2006/0180674 A1 | 8/2006 | Margalit et al. |
| 2006/0181716 A1 | 8/2006 | Hoshina |
| 2006/0255158 A1 | 11/2006 | Margalit et al. |
| 2006/0273154 A1 | 12/2006 | Dan |
| 2006/0278723 A1 | 12/2006 | Dan et al. |
| 2006/0288169 A1 | 12/2006 | Steiner |
| 2007/0028046 A1 | 2/2007 | Pham |
| 2007/0099511 A1 | 5/2007 | Miller et al. |
| 2007/0153565 A1 | 7/2007 | Nomura et al. |
| 2007/0243769 A1 | 10/2007 | Atsmon et al. |
| 2007/0252010 A1 | 11/2007 | Gonzalez et al. |
| 2008/0087731 A1 | 4/2008 | Gonzalez et al. |
| 2008/0109309 A1 | 5/2008 | Landau et al. |
| 2008/0224320 A1 | 9/2008 | Palmade et al. |
| 2008/0239406 A1 | 10/2008 | Nakano |
| 2008/0294991 A1 | 11/2008 | Wong et al. |
| 2008/0299788 A1 | 12/2008 | Balchaytis |
| 2009/0009829 A1 | 1/2009 | Katsuyama |
| 2009/0014522 A1 | 1/2009 | Harris et al. |
| 2009/0063755 A1 | 3/2009 | Perng et al. |
| 2010/0218021 A1 | 8/2010 | Ma et al. |
| 2010/0289844 A1 * | 11/2010 | Seibt .............................. 347/15 |

FOREIGN PATENT DOCUMENTS

| | | |
|---|---|---|
| EP | 098227309 | 5/2012 |
| WO | WO 2005/124932 A2 | 12/2005 |
| WO | WO 2008/020442 | 2/2008 |
| WO | WO 2008/036537 | 3/2008 |
| WO | PCT/US2009/061725 | 6/2010 |
| WO | PCT/US2009/061725 | 4/2011 |
| WO | WO PCT/US2011/031432 | 12/2011 |
| WO | WO PCT/US2011/031473 | 12/2011 |
| WO | WO PCT/US2011/031645 | 12/2011 |
| WO | WO PCT/US2011/031646 | 12/2011 |
| WO | WO PCT/US2011/031432 | 10/2012 |
| WO | WO PCT/US2011/031473 | 10/2012 |
| WO | WO PCT/US2011/031645 | 10/2012 |
| WO | WO PCT/US2011/031646 | 10/2012 |

OTHER PUBLICATIONS

Website—www.minicdwizard; 2000; 1 p.
"Unversal Serial Bus Specification Revision 2.0"; Figure 6.9; pp. 99; Feb. 1998.

* cited by examiner

MEMORY PROGRAMMING METHODS AND MEMORY PROGRAMMING DEVICES

RELATED PATENT DATA

This application claims the benefit of U.S. Provisional Patent Application Ser. No. 61/321,801 filed Apr. 7, 2010, which is incorporated herein by reference, and is a continuation in part of U.S. patent application Ser. No. 12/604,300 filed Oct. 22, 2009 now U.S. Pat. No. 8,047,443, which is also incorporated herein by reference and to which this application claims priority.

TECHNICAL FIELD

The present disclosure, in various embodiments, relates to memory programming methods and memory programming devices.

BACKGROUND OF THE INVENTION

It is now possible to create electronic memory capable of storing electronic data by printing electrically active ink on various substrates, such as paper, using standard printing technology, such as inkjet, flexographic, rotogravure, and screen printing.

BRIEF DESCRIPTION OF THE DRAWINGS

Preferred embodiments of the disclosure are described below with reference to the following accompanying drawings.

DETAILED DESCRIPTION OF THE PREFERRED EMBODIMENTS

Figure 1:
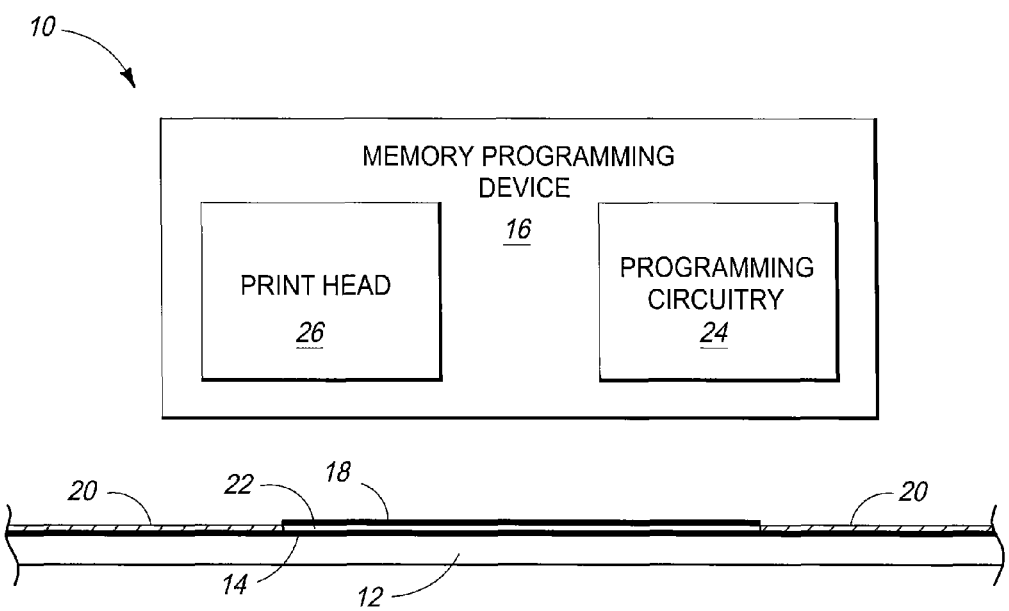
FIG. 1 illustrates a cross sectional view of a memory cell on a substrate and a memory programming device in accordance with an embodiment.

Described herein are methods of programming printed memory with desired electronic data (e.g., music, a picture, a brochure, etc.) during the printing process, such that upon curing, the printed memory contains the desired electronic data.

Printed memory can take various forms. In one implementation, a material having specific electrical properties is layered between conductive traces such that a memory cell storing one bit of information is formed at each trace intersection. The conductive traces and the material are printed onto a substrate, for example a paper substrate. This memory may or may not be reprogrammable depending on the materials used in the memory cell. Other memory can be formed by simply creating a pattern of short circuits between a positive voltage and ground. Each short to ground may be considered one data value (e.g., a zero), and each short to the positive voltage may be considered another data value (e.g., a one). This memory would typically not be reprogrammable.

According to one embodiment of a method, a print head deposits a first material at the intersection of a pair of conductive traces if the intersection is to represent a digital zero and deposits a different second material at the intersection if the intersection is to represent a digital one. The electrical phenomenon measured to "read" the memory may differ depending on the properties of the first and second materials. The first and second materials may be conductive, magnetic, capacitive, resistive, inductive, or some combination of these various phenomena. Example materials include magnetic ink and ferromagnetic liquid.

In another embodiment of the invention, each memory cell may be programmed with a bit value during the deposition of a material (which may be in the form of an ink) at the intersection of a pair of traces that forms the memory cell by applying an electric field and/or magnetic field to the material as or after the material is printed onto the substrate (e.g., paper substrate) and/or while the material is curing (e.g., drying). For example, a print head used to deposit the material on the substrate may include programming circuitry that can selectively program an individual memory cell by applying an electric and/or magnetic field that orients magnetic portions of the material in a particular way. The print head may be configured to program the bit to be a digital zero by orienting the magnetic portions of the material in a first direction. Similarly, the print head may be configured to program the bit to be a digital one by orienting the magnetic portions of the material in a second direction different from the first direction, for example, a direction opposite that of the first direction. Alternatively, the print head may be configured to program the bit to be a digital zero by changing a resistance of the material to a relatively high-resistance state and may be configured to program the bit to be a digital one by changing the resistance of the material to a relatively low-resistance state in relation to the high resistance state.

Other techniques may also be used. For example, the print head may be configured to program the bit to be a digital zero by storing a relatively large amount of charge in the material and may be configured to program the bit to be a digital one by storing a relatively small amount of charge in the material.

Although a bit may be programmed at the time of printing to be a digital zero, it may later be reprogrammed to be a digital one by using the programming circuitry of the print head (or other programming circuitry of a programming device not associated with a print head) to apply an electric and/or magnetic field to the material of the memory cell. In one embodiment, the programming circuitry may be positioned proximate the memory cell to be programmed so that the electric and/or magnetic field produced by the programming circuitry intersects the material of the memory cell. While applying the electric and/or magnetic field to the memory cell, other memory cells adjacent the memory cell might not be affected by the electric and/or magnetic field. As a result, the memory cell may be re-programmed by the electric and/or magnetic field but other memory cells adjacent the memory cell are not re-programmed by the electric and/or magnetic field.

In yet another embodiment of the invention, multiple memory cells of an array of memory cells may be programmed in parallel (e.g., substantially simultaneously), as or shortly after they are printed on the substrate, by a suitably configured, one-dimensional or two-dimensional array of electrical, magnetic, or electro-magnetic fields positioned proximate to the memory cells so that individual of the fields are aligned with individual memory cells. The fields could add or remove charge to individual memory cells, or flip magnetic domains in individual memory cells, change resistance of the memory cells, or a combination of the above, to accomplish the arbitrary configuration of the memory array with the data desired.

In yet another embodiment of the invention, careful controlling the environment during printing and curing may be used to induce the various memory cells to assume arbitrary values of zero or one once cured. In this embodiment, various combinations of external influences such as magnetic fields, electric fields, vacuum, pressure, gasses of various sorts, and light may also be brought to bear to create the desired outcome. The external influences may affect the amount of charge stored by a memory cell, the resistance of the memory cell, the conductivity of the memory cell, the orientation of magnetic material of the memory cell, or other characteristics of the memory cell. In one embodiment, memory cells programmed in this manner may be one-time programmable rather than reprogrammable.

In another embodiment of the invention, each memory cell may be programmed with a bit value during the deposition of a material (which may be in the form of an ink) at the intersection of a pair of traces that forms the memory cell by applying an light beam (e.g., from a laser) to the material as or after the material is printed onto the substrate (e.g., paper substrate) and/or while the material is curing (e.g., drying). For example, a print head used to deposit the material on the substrate may include programming circuitry that can selectively program an individual memory cell by applying light that changes a characteristic (e.g., amount of charge stored, resistance, orientation of magnetic poles of portions of the material, etc.) of the material in a particular way.

In yet another embodiment, multiple memory cells of an array of memory cells may be programmed in parallel (e.g., substantially simultaneously) while the array is being printed by a suitably configured, one-dimensional or two-dimensional array of light beams positioned in proximity to the multiple memory cells. In this case, the individual light beams may be aligned with individual memory cells.

Referring to FIG. 1, a cross sectional view of a memory cell construction 10 is illustrated according to one embodiment. An electrically conductive bitline 14 is formed on a substrate 12. Bitline 14 may extend horizontally and may be shared with other memory cells not illustrated in FIG. 1.

Substrate 12 may comprise paper and bitline 14 may be formed on substrate 12 by printing electrically conductive ink on substrate 12. In forming bitline 14, an electrically conductive ink may be deposited on substrate 12 in a desired pattern by a print head. In one embodiment, substrate 12 may be a lamination of several layers of paper and adhesive. In other embodiments, substrate 12 might not comprise paper, but may comprise plastic, Mylar, or other flexible, suitable for printing with ink by a printer.

In one embodiment, an electrically insulative material 20 is printed on top of portions of bitline 14 and memory cell 22 is printed on top of portions of bitline 14. In one embodiment, memory cell 22 is printed before insulative material 20. In other embodiments, insulative material 20 is printed before memory cell 22. In printing memory cell 22, memory material, such as the memory materials described herein, may be deposited on substrate 12 in a desired pattern by a print head.

An electrically conductive wordline 18 is printed above memory cell 22 using electrically conductive ink. Wordline 18 may extend into and out of the page in a direction orthogonal to the direction that bitline 14 extends. In forming wordline 18, an electrically conductive ink may be deposited on substrate 12 in a desired pattern by print head 26.

In the embodiment illustrated in FIG. 1, wordline 18 and bitline 14 may both be in direct physical contact with memory cell 22 and may both be ohmically connected to memory cell 22. Memory cell 22 may store data and may be programmed using one or more of the methods described herein.

Also illustrated in FIG. 1 is memory programming device 16 which includes programming circuitry 24 and print head 26. Memory programming device 16 is positioned proximate memory cell 22 and is configured to alter a characteristic of memory cell 22. For example, in one embodiment, programming circuitry 24 may include a coil or other circuitry configured to generate a magnetic field directed downward that intersects memory cell 22. Print head 26 is configured to deposit ink or other materials on substrate 12. Programming circuitry 24 and print head 26 may be moved relative to substrate 12. Programming circuitry 24 and print head 26 are represented as functional blocks in FIG. 1.

Figure 2:
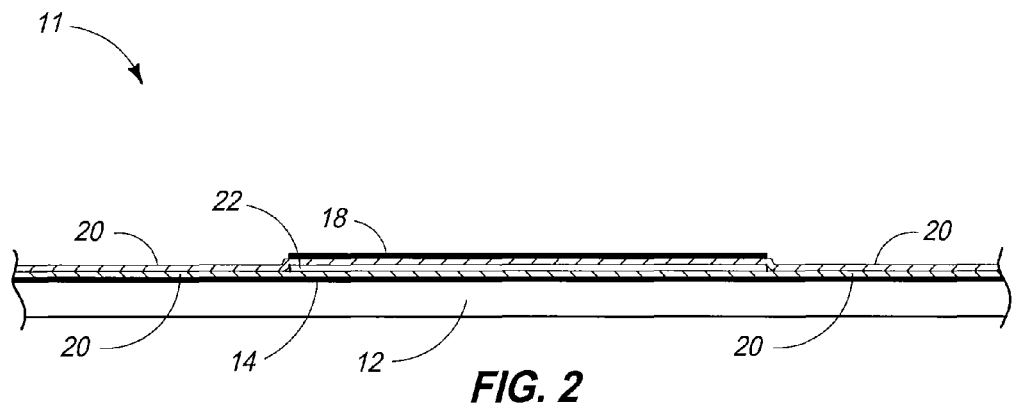
FIG. 2 illustrates a cross sectional view of a memory cell on a substrate in accordance with an embodiment.

Referring to FIG. 2, a cross sectional view of another embodiment of a memory cell construction 11 is illustrated according to one embodiment. Construction 11 is similar to construction 10, except that insulative material 20 is printed between bitline 14 and memory cell 22 and between memory cell 22 and wordline 18. In this embodiment, bitline 14 and wordline 18 are not ohmically connected to memory cell 22. However, a current may still be induced in bitline 14 as a result of a voltage or current present in wordline 18 depending on the programmed state of memory cell 22.

Figure 3:
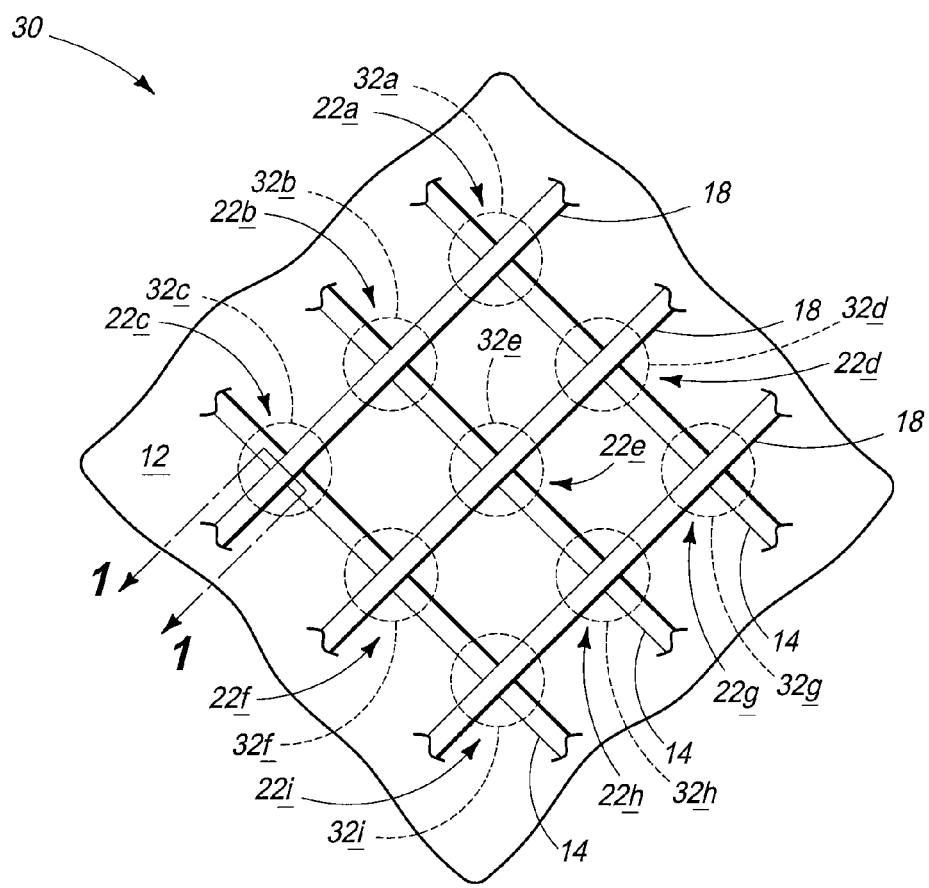
FIG. 3 illustrates a top view of an array of memory cells in accordance with an embodiment.

Referring to FIG. 3, a top view of an array 30 of memory cells 22 formed on substrate 12 is illustrated according to one embodiment. The array 30 includes a plurality of bitlines 14 extending in a direction perpendicular to an array of wordlines 18. Memory cells 22 ($22a$, $22b$, $22c$, $22d$, $22e$, $22f$, $22g$, $22h$, and $22i$) are formed at the intersections of bitlines 14 and wordlines 18. When storing data in a memory cell 22 of array 30, programming circuitry may direct a field or light beam in a target area 32.

For example, to store data in memory cell $22e$, programming circuitry may direct a magnetic field in target area $32e$. In doing so, the magnetic field may be configured so that portions of the magnetic field that intersect target areas $32a$, $32b$, $32c$, $32d$, $32f$, $32g$, $32h$, and $32i$ do not alter data stored in memory cells $22a$, $22b$, $22c$, $22d$, $22f$, $22g$, $22h$, and $22i$.

Figure 4:
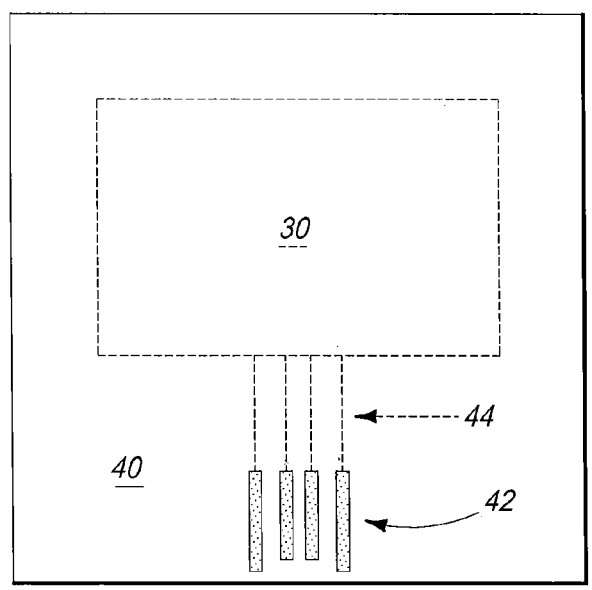
FIG. 4 illustrates a piece of paper comprising an array of memory cells and a data interface in accordance with an embodiment.

Referring to FIG. 4, a laminated piece of paper 40 is illustrated which comprises memory array 30, as well as connecting circuitry 44 and data interface 42. Laminated paper 40 may include two layers of paper. A first layer of paper on which array 30 is printed and a second layer of paper covering array 30. The first and second layers of paper may be laminated together so as to make array 30 inaccessible.

Connecting circuitry 44 may be printed on the first layer of paper and data interface 42 may be printed on the second layer of paper and may be electrically connected to connecting circuitry 44. In one embodiment, data interface 42 may be a Universal Serial Bus (USB) interface suitable for connecting to a computer or other data communication device. The computer or other data communication device may send data to memory array 30 via data interface 42. In some embodiments, paper 40 may be folded, cut, or otherwise modified so that data interface 42 fits within a standard USB receptacle.

In one embodiment, data interface 42 may more broadly comprise connecting circuitry 44 as well as a circuitry printed on the first layer, such as buffers. In this embodiment, data interface 42 may be configured to receive data from the computer or other data communication device and buffer the received data prior to the data being written to memory array 30. For example, data interface 42 may be a USB interface configured to receive data via a USB protocol and to buffer the data prior to the data being written to memory array 30.

According to one embodiment, memory programming methods include depositing memory material (e.g., the material of memory cell 22) above a first portion of an electrically conductive bitline (e.g., bitline 14) printed on a substrate (e.g.

substrate 12) to form a memory cell (e.g., memory cell 22) and using programming circuitry positioned proximate the memory cell, storing data in the memory cell by altering a characteristic of the memory cell, the characteristic remaining altered after the programming circuitry is moved away from the memory cell.

In one embodiment, the substrate may comprise paper, and the memory material may be magnetic ink. The depositing of the memory material may include depositing the memory material with an ink jet print head. In one embodiment, the method may include forming the wordline before storing the data. For example, memory cell 22 of FIG. 1 may be programmed before wordline 18 is printed. Alternatively, the method may include forming (e.g., printing) wordline 18 after storing the data in memory cell 22.

The programming circuitry may be free of physical contact with the memory cell during the altering of the characteristic. For example, programming circuitry 24 may be positioned above memory cell 22 and may be spaced from memory cell 22 as illustrated in FIG. 1. However, the programming circuitry may be positioned proximate the memory cell so that a field (e.g., electric and/or magnetic field) or light beam (e.g., laser beam) generated by the programming circuitry may intersect the memory cell. Accordingly, the programming circuitry may be free of ohmic contact with the memory cell during the altering of the characteristic. Further, in one embodiment, the programming circuitry may be in physical contact with the memory cells, for example, when the memory material is deposited on the substrate, but might not be in ohmic contact with the memory cell.

The altering of the characteristic of the memory cell may include altering the characteristic while at least a portion of the memory cell is in a liquid state (e.g., before the memory material of FIG. 1 cures to form memory cell 22). Alternatively, the altering may take place after the memory material has cured. One or more of several different characteristics may be altered to store the data. For example, the characteristic may be one or more of the following characteristics: a magnetic orientation of the memory cell, an electrical resistance of the memory cell, an electrical inductance of the memory cell, or an electrical capacitance of the memory cell. Alternatively, the characteristic altered may be some other physical phenomenon of the memory material.

The characteristic may be altered in one or more of a number of different ways. The altering of the characteristic may include the programming circuitry applying an electric field, a magnetic field, and/or an electromagnetic field to the memory cell. Alternatively or additionally, the altering of the characteristic may include the programming circuitry changing an amount of electrical charge stored by the memory cell, for example by increasing the amount of electrical charge stored by the memory cell or decreasing the amount of electrical charge stored by the memory cell.

In one embodiment, the altering of the characteristic may include the programming circuitry applying a magnetic field to the memory cell. The magnetic field may orient magnetic poles of the memory cell in a direction. The application of the magnetic field to the memory cell by the programming circuitry may then be ceased, but the magnetic poles of the memory cell may retain the orientation despite the ceasing of the application of the magnetic field. Accordingly, the memory cell may be described as being non-volatile since it retains the data by way of the orientation of the magnetic poles of the memory cell even when the magnetic field is not present.

Alternatively or additionally, the storing of the data may include exposing the memory cell to a laser beam while the memory material is curing. In this case, programming circuitry 24 may comprise a laser.

The programming methods may further include forming a wordline above the memory cell. The wordline may cross the first portion of the bitline. After the programming circuitry stores the data in the memory cell, the wordline and the bitline may be used to alter the data stored in the memory cell without the use of the programming circuitry. For example, a voltage may be imposed across the wordline and the bitline and a value of the data stored in the memory cell may be determined based on a current carried by the bitline, the current resulting from the voltage imposed across the wordline and bitline.

According to one embodiment, a memory programming device (e.g., memory programming device 16) includes a print head (e.g., print head 26) that moves across a substrate to deposit memory material on the substrate to form an array of memory cells and programming circuitry (e.g., programming circuitry 24) coupled to the print head so that the programming circuitry moves across the substrate along with the print head. For each individual memory cell of the array, the programming circuitry is positioned proximate the individual memory cell and writes data to the individual memory cell.

Other memory programming devices may alternatively be used to program array 30 in which the programming circuitry moves across the substrate independent of the print head such that the print head and programming circuitry are decoupled.

As was mentioned above, the programming circuitry may write data to the individual memory cell by altering a characteristic of the memory cell, the characteristic remaining altered after the programming circuitry is moved away from the individual memory cell.

The print head may form a first memory cell of the array (e.g., memory cell 22e) and the programming circuitry may write data to the first memory cell of the array prior to the print head forming a second memory cell (e.g., memory cell 22i) of the array. In this embodiment, the print head might not form wordlines 18 until after the programming circuitry has written data to the memory cells of the array.

In one embodiment, the programming circuitry may write the data to the memory cells by controlling the print head to deposit a first memory material in memory cells of the array storing a first binary value (e.g., a zero) and to deposit a second memory material in memory cells of the array storing a second binary value (e.g., a one) different from the first binary value. The first memory material may have an electrical characteristic that is different from an electrical characteristic of the second memory material. For example, the first memory material may have a greater electrical resistance than the second memory material.

The programming circuitry may write data to the individual memory cell (e.g., memory cell 22e) by applying an electric and/or magnetic field to the individual memory cell and the memory programming device may prevent the field from altering data written to other memory cells of the array (e.g., memory cells 22a, 22b, 22c, 22d, 22f, 22g, 22h, 22i) while the programming circuitry is writing data to the individual memory cell (e.g., memory cell 22e). In one embodiment, the memory programming device may prevent the field from altering the data written to other memory cells of the array by positioning the programming circuitry closer to the individual memory cell than any other memory cell of the array.

For example, the programming circuitry may be configured to emit a very narrow, directional magnetic field that is positioned so as to intersect one memory cell of the array (e.g., memory cell 22e through target area 32e), but is sufficiently directional and narrow that other memory cells of the array (e.g., memory cells 22a, 22b, 22c, 22d, 22f, 22g, 22h, 22i) receive a highly attenuated version of the field that is not strong enough to alter the data stored in the adjacent memory cells.

According to another embodiment, a memory programming method includes moving a print head across a substrate to deposit conductive ink on the substrate to form an array of bitlines intersecting an array of wordlines. The method also includes moving a print head across a substrate to deposit memory material to form an array of memory cells, the memory cells being located at the intersections of the bitlines and wordlines. The method further includes iteratively positioning programming circuitry in a plurality of different locations relative to the substrate and in each of the locations of the plurality, using the programming circuitry to write data to a different subset of the memory cells of the array. In one embodiment, each of the subsets of the memory cells may consist of a single memory cell of the array. In other embodiments, each of the subsets of memory cells may comprise a plurality of the memory cells of the array.

The programming circuitry may write data to a first memory cell of the array by orienting magnetic poles of the first memory cell in a first direction and may write a second memory cell of the array by orienting magnetic poles of the second memory cell in a direction opposite the first direction.

The data written by the programming circuitry may be referred to as first data and the memory programming method may further include forming a data interface (e.g., data interface 42) on the substrate, for example, a USB interface. The data interface may be configured to receive second data from a data source distinct from the substrate, to buffer the received second data, and to store the buffered second data in the memory cells independent of the programming circuitry by applying voltages and/or currents to the wordlines and bitlines. In one embodiment, the data source may be a computer or other device configured to send and/or receive data.

The data interface may provide a way to program the memory cells that is distinct from the programming circuitry. In one embodiment, the programming circuitry may program the memory cells of the array as the memory cells are printed on a substrate and before the data interface is ever formed or used. Once the memory array has been fully formed, the data interface may be used to alter the data that the programming circuitry previously stored in the memory cells.

Accordingly, the programming circuitry may write the first data to the memory cells (e.g., memory cells 22) prior to the forming of the data interface (e.g., data interface 42). The programming circuitry may write the first data to the memory cells prior to the data interface receiving any data from the data source. The programming circuitry may write the first data to the memory cells independent of the data interface. The programming circuitry may write the first data to the memory cells prior to the first time that the data interface is ever used to receive and buffer data from any data source.

By way of clarification, it should be noted that the data that the programming circuitry writes to the memory cells may include an arbitrary mixture of binary values, rather than all zeros, all ones, or some other predetermined pattern of zeroes and ones. In one embodiment, the data that the programming circuitry writes to the memory cells may be data of an image, video, document, database, email, etc.

APPLYING THE INVENTION

The invention would be typically exercised by (1) applying the various requisite inks in layers onto a substrate (paper, or Mylar film for example), and (2) by controlling the environment and/or bringing the requisite external influences to bear during and/or shortly after printing and/or during curing, such that the finished memory is not blank but contains the desired data.

By way of example, the methods described herein may be used to program devices such as the devices described in U.S. patent application Ser. No. 12/604,300.

The invention claimed is:

1. A memory programming method comprising:
depositing memory material above a first portion of an electrically conductive bitline printed on a substrate to form a memory cell; and
using programming circuitry positioned proximate the memory cell, storing data in the memory cell by altering a characteristic of the memory cell, the characteristic remaining altered after the programming circuitry is moved away from the memory cell, wherein the altering comprises:
applying a magnetic field to the memory cell, the magnetic field orienting magnetic poles of the memory cell in a direction; and
ceasing the application of the magnetic field, the magnetic poles of the memory cell retaining the orientation despite the ceasing of the application of the magnetic field.

2. The method of claim 1 wherein the programming circuitry is free of physical contact with the memory cell during the altering of the characteristic.

3. The method of claim 1 wherein the altering comprises altering the characteristic while at least a portion of the memory cell is in a liquid state.

4. The method of claim 1 wherein the substrate comprises paper.

5. The method of claim 1 wherein the memory material comprises magnetic ink.

6. The method of claim 1 wherein the depositing comprises depositing the memory material with an ink jet print head.

7. The method of claim 1 further comprising forming a wordline above the memory cell after the storing of the data, the wordline crossing the first portion of the bitline.

8. A memory programming method comprising:
moving a print head across a substrate to deposit conductive ink on the substrate to form an array of bitlines intersecting an array of wordlines;
moving a print head across a substrate to deposit memory material to form an array of memory cells, the memory cells being located at the intersections of the bitlines and wordlines;
iteratively positioning programming circuitry in a plurality of different locations relative to the substrate; and
in each of the locations of the plurality, using the programming circuitry to write data to a different subset of the memory cells of the array, wherein the data written by the programming circuitry is first data and further comprising forming a data interface on the substrate, the data interface being configured to receive second data from a datra source distinct from the substrate, to buffer the received second data, and to store the buffered second data in the memory cells independent of the programming circuitry by applying voltages and/or currents to the wordlines and bitlines.

9. The method of claim 8 wherein the programming circuitry writes data to a first memory cell of the array by orienting magnetic poles of the first memory cell in a first direction and writes a second memory cell of the array by orienting magnetic poles of the second memory cell in a direction opposite the first direction.

10. The method of claim 8 wherein the programming circuitry writes the first data to the memory cells prior to the forming of the data interface.

11. The method of claim 8 wherein the programming circuitry writes the first data to the memory cells prior to the first time that the data interface is ever used to receive and buffer data from any data source.

12. The method of claim 8 wherein each of the subsets of the memory cells consists of a single memory cell of the array.

13. A memory programming device comprising:
a print head that moves across a substrate to deposit memory material on the substrate to form an array of memory cells; and
programming circuitry coupled to the print head so that the programming circuitry moves across the substrate along with the print head and that, for individual memory cells of the array, is positioned proximate the individual memory cell and writes data to the individual memory cell, wherein the print head forms a first memory cell of the array and the programming circuitry writes data to the first memory cell of the array prior to the print head forming a second memory cell of the array.

14. The device of claim 13 wherein the programming circuitry writes data to the individual memory cell by altering a characteristic of the memory cell, the characteristic remaining altered after the programming circuitry is moved away from the individual memory cell.

15. The device of claim 13 wherein the programming circuitry writes the data to the memory cells by controlling the print head to deposit a first memory material in memory cells of the array storing a first binary value and to deposit a second memory material in memory cells of the array storing a second binary value different from the first binary value, the first memory material having an electrical characteristic that is different from an electrical characteristic of the second memory material.

16. The device of claim 13 wherein the programming circuitry writes data to the individual memory cell by applying an electric and/or magnetic field to the individual memory cell and the memory programming device prevents the field from altering data written to other memory cells of the array while the programming circuitry is writing data to the individual memory cell.

17. The device of claim 16 wherein the memory programming device prevents the field from altering the data written to other memory cells of the array by positioning the programming circuitry closer to the individual memory cell than any other memory cell of the array.

\* \* \* \* \*